United States Patent
Fujita et al.

(10) Patent No.: US 9,281,095 B2
(45) Date of Patent: Mar. 8, 2016

(54) ALUMINA COMPOSITE, METHOD FOR MANUFACTURING ALUMINA COMPOSITE, AND POLYMER COMPOSITION CONTAINING ALUMINA COMPOSITE

(75) Inventors: Takayuki Fujita, Nagano (JP); Atsushi Odaka, Nagano (JP)

(73) Assignee: TAIMEI CHEMICALS CO., LTD., Nagano (JP)

( * ) Notice: Subject to any disclaimer, the term of this patent is extended or adjusted under 35 U.S.C. 154(b) by 244 days.

(21) Appl. No.: 14/003,793

(22) PCT Filed: Jan. 26, 2012

(86) PCT No.: PCT/JP2012/000506
§ 371 (c)(1),
(2), (4) Date: Sep. 6, 2013

(87) PCT Pub. No.: WO2012/127765
PCT Pub. Date: Sep. 27, 2012

(65) Prior Publication Data
US 2013/0338292 A1    Dec. 19, 2013

(30) Foreign Application Priority Data
Mar. 23, 2011    (JP) .................................. 2011-064773

(51) Int. Cl.
*H01B 1/18*    (2006.01)
*C04B 35/00*    (2006.01)
(Continued)

(52) U.S. Cl.
CPC . *H01B 1/18* (2013.01); *B82Y 30/00* (2013.01); *C04B 35/117* (2013.01);
(Continued)

(58) Field of Classification Search
CPC .............. H01B 1/00; H01B 1/06; H01B 1/18; B82Y 40/00; C04B 35/10; C04B 35/117; C04B 20/008; C01B 2202/00
See application file for complete search history.

(56) References Cited

U.S. PATENT DOCUMENTS 5,447,894 A * 9/1995 Yasuoka ............... C04B 35/117
264/654
5,894,035 A * 4/1999 Cinibulk ............... C04B 41/009
264/620

(Continued)

FOREIGN PATENT DOCUMENTS

CN    1095360 A    11/1994
JP    H07-206430 A    8/1995
(Continued)

OTHER PUBLICATIONS

European Patent Office, Extended European Search Report for EP Patent Application No. 12761064.0, Mar. 23, 2015.
(Continued)

*Primary Examiner* — Mark Kopec

(57) ABSTRACT

For the purpose of producing an alumina composite in which the integrity between alumina and an inorganic material is further improved, a dispersion liquid preparation step, a solidification step and a burning step are performed, wherein the dispersion liquid preparation step comprises preparing a dispersion liquid in which an inorganic material such as a carbon material is homogeneously dispersed in an alumina raw material solution having an organic additive dissolved therein, the solidification step comprises drying the dispersion liquid to produce a solid raw material, and burning step comprises burning the solid raw material in a non-acidic atmosphere while contacting hydrogen chloride with the solid raw material. In this manner, an alumina composite can be produced, in which at least a portion of an inorganic material such as a carbon material is embedded in the inside of each of α-alumina single crystal particles the constitute alumina particles.

4 Claims, 10 Drawing Sheets

(51) Int. Cl.
  *C04B 35/628* (2006.01)
  *H01B 1/04* (2006.01)
  *C04B 35/117* (2006.01)
  *C04B 35/624* (2006.01)
  *C04B 35/634* (2006.01)
  *C04B 35/80* (2006.01)
  *C08K 7/00* (2006.01)
  *C30B 7/02* (2006.01)
  *C30B 29/60* (2006.01)
  *C30B 29/20* (2006.01)
  *B82Y 30/00* (2011.01)

(52) U.S. Cl.
  CPC ........ *C04B 35/624* (2013.01); *C04B 35/62839* (2013.01); *C04B 35/62892* (2013.01); *C04B 35/63488* (2013.01); *C04B 35/803* (2013.01); *C08K 7/00* (2013.01); *C30B 7/02* (2013.01); *C30B 29/20* (2013.01); *C30B 29/60* (2013.01); *H01B 1/04* (2013.01); *C01P 2004/04* (2013.01); *C01P 2004/13* (2013.01); *C01P 2004/51* (2013.01); *C01P 2004/61* (2013.01); *C04B 2235/3217* (2013.01); *C04B 2235/3218* (2013.01); *C04B 2235/445* (2013.01); *C04B 2235/5248* (2013.01); *C04B 2235/5264* (2013.01); *C04B 2235/5288* (2013.01); *C04B 2235/5427* (2013.01); *C04B 2235/5436* (2013.01); *C04B 2235/5445* (2013.01); *C04B 2235/5481* (2013.01); *Y10T 428/2982* (2015.01)

(56) References Cited

U.S. PATENT DOCUMENTS

| | | | |
|---|---|---|---|
| 5,935,550 | A | 8/1999 | Mohri et al. |
| 6,066,584 | A * | 5/2000 | Krell .................... C04B 35/111 |
| | | | 264/603 |
| 6,159,441 | A | 12/2000 | Mohri et al. |
| 2004/0167009 | A1 | 8/2004 | Kuntz et al. |
| 2004/0217520 | A1 | 11/2004 | Hong et al. |
| 2005/0067607 | A1* | 3/2005 | Zhan .................... B82Y 30/00 |
| | | | 252/502 |
| 2007/0166531 | A1* | 7/2007 | Ohnishi ................ C09C 1/043 |
| | | | 428/323 |

FOREIGN PATENT DOCUMENTS

| | | |
|---|---|---|
| JP | 2004-244273 A | 9/2004 |
| JP | 2004-256382 A | 9/2004 |
| JP | 2006-327886 A | 12/2006 |
| JP | 4031397 B2 | 1/2008 |

OTHER PUBLICATIONS

Song Bi et al., "Mechanical properties and oxidation resistance of a-alumina/multi-walled carbon nanotube composite ceramics", Materials Science and Engineering A, vol. 528, vol. 3, pp. 1596-1601, Nov. 3, 2010.

International Search Report for PCT/JP212/000506, Mar. 19, 2012.

Jing Sun et al., Colloidal Processing of Carbon Nanotube/Alumina Composites, Publication on Website, Nov. 7, 2002, pp. 5169-5172, Chem. Mater. 2002, 14, American Chemical Society.

* cited by examiner

FIG.9
(a)
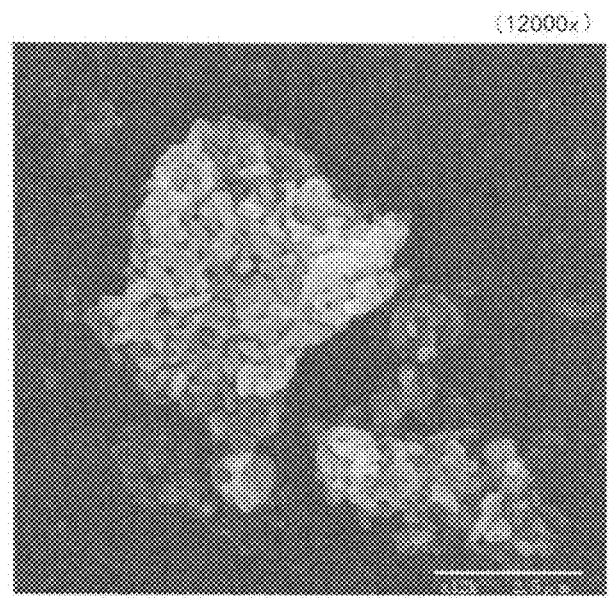
(b)
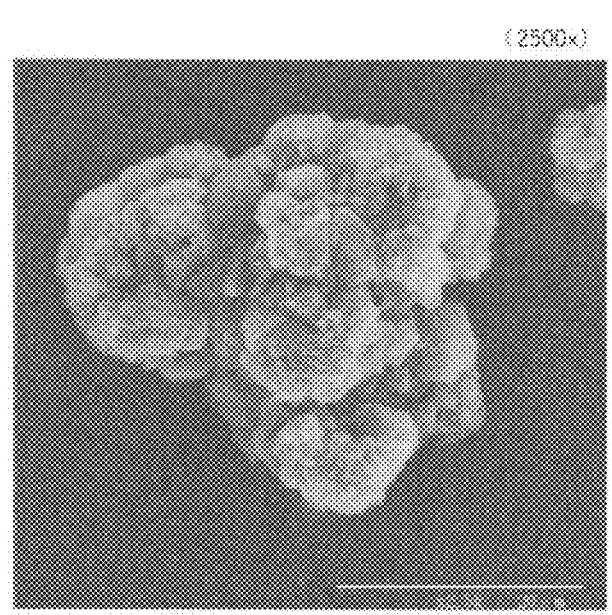

ALUMINA COMPOSITE, METHOD FOR MANUFACTURING ALUMINA COMPOSITE, AND POLYMER COMPOSITION CONTAINING ALUMINA COMPOSITE

TECHNICAL FIELD

The present invention relates to an alumina composite in which alumina particles and an inorganic material are compounded, a method for manufacturing an alumina composite, and a polymer composition containing an alumina composite.

BACKGROUND ART

A composite material in which a plurality of materials are integrated and compounded can be expected to have characteristics that are not obtainable from a simple material. For example, it is anticipated that by adding a nanocarbon such as carbon nanotubes, for example, to various materials to make composite materials, the mechanical performance of a matrix can be enhanced, and electrical conduction properties, heat conduction properties, and various other types of functionality can be imparted.

A technique has therefore been proposed for obtaining a ceramic-based nano-composite powder in which carbon nanotubes are dispersed in an alumina matrix, by performing a step for dispersing carbon nanotubes in a dispersion solvent and then sonicating the dispersion solution, a step for mixing a water-soluble metal salt capable of becoming a ceramic matrix material with the dispersion solution, a step for sonicating the liquid dispersion mixture, and a step for drying/firing the liquid dispersion mixture (see Patent Document 1).

A method has also been proposed for manufacturing a solid alumina composite by obtaining an alumina composite precursor in which a nanocarbon is uniformly dispersed by dispersing the nanocarbon in a liquid aluminum compound, and then thermally decomposing the alumina composite precursor (see Patent Document 2).

PRIOR ART DOCUMENTS

Patent Documents

[Patent Document 1] JPB 4031397
[Patent Document 2] JPA 2006-327886

SUMMARY OF THE INVENTION

Problems to be Solved by the Invention

However, in the composites obtained by the techniques disclosed in Patent Documents 1 and 2, although the inorganic material is dispersed and integrated in the bulk of the alumina, carbon material is present on the surfaces and grain boundaries of single-crystal α-alumina particles, and a configuration in which the carbon material is partially buried inside the single-crystal α-alumina particles is not obtained.

Meanwhile, further enhancement of functioning with regard to mechanical performance, electrical conduction properties, heat conduction properties, and the like is anticipated from alumina composites.

Therefore, an object of the present invention is to provide an alumina composite in which integration of alumina and inorganic material is further increased, a method for manufacturing an alumina composite, and a polymer composition containing an alumina composite.

Means to Solve the Problems

In order to solve the abovementioned problems, the alumina composite according to the present invention is characterized in that an inorganic material is at least partially embedded inside single-crystal α-alumina particles which constitute alumina particles.

In the present invention, the inorganic material is a filamentous inorganic material, for example.

In the present invention, the inorganic material is a carbon material comprising any of single-wall carbon nanotubes, double-wall carbon nanotubes, multi-wall carbon nanotubes, carbon nanofibers, vapor-grown carbon fibers, and fullerenes, for example.

Preferably, in the present invention, the average particle diameter of the alumina particles is 0.1 to 100 μm, and the D90/D10 particle size distribution of the alumina particles is 10 or less, where D90 and D10 are the particle diameters for a cumulative 10% and a cumulative 90%, respectively, from the fine particle side of the cumulative particle size distribution of the alumina particles.

The method for manufacturing an alumina composite according to the present invention is characterized in having a dispersion liquid preparation step for dissolving an organic additive in an alumina raw material liquid and uniformly dispersing an inorganic material in the alumina raw material liquid to prepare a dispersion liquid, a solidification step for drying the dispersion liquid to obtain a solidified raw material, and a firing step for firing the solidified raw material in a non-oxidizing atmosphere while bringing hydrogen chloride into contact with the solidified raw material.

In the present invention, alumina seed crystals are preferably added to the dispersion liquid in the dispersion liquid preparation step.

In the present invention, a method can be employed in which the alumina raw material liquid is a solution of the alumina raw material. For example, the alumina raw material liquid is preferably a basic aluminum chloride solution in which basic aluminum chloride is dissolved as the alumina raw material, and hydrogen chloride generated from the solidified raw material as the hydrogen chloride is preferably brought into contact with the solidified raw material in the firing step. Through this configuration, there is no need to separately perform an operation for bringing hydrogen chloride into contact with the solidified raw material in the firing step.

In the present invention, a method may be employed in which the alumina raw material liquid is a liquid in which the alumina raw material is dispersed. For example, the alumina raw material liquid may be a boehmite dispersion liquid in which boehmite is dispersed as the alumina raw material, in which case hydrogen chloride is supplied to the solidified raw material in the firing step.

The alumina composite according to the present invention is, for example, impregnated into a resin or rubber, and used to manufacture a polymer composition containing the alumina composite. The alumina composite according to the present invention can also be sintered with other materials and used to manufacture ceramics.

BRIEF DESCRIPTION OF THE DRAWINGS

FIG. 9 is an electron micrograph showing the alumina particles according to Comparative Example 2 of the present invention.

MODE FOR CARRYING OUT THE INVENTION

Figure 1:
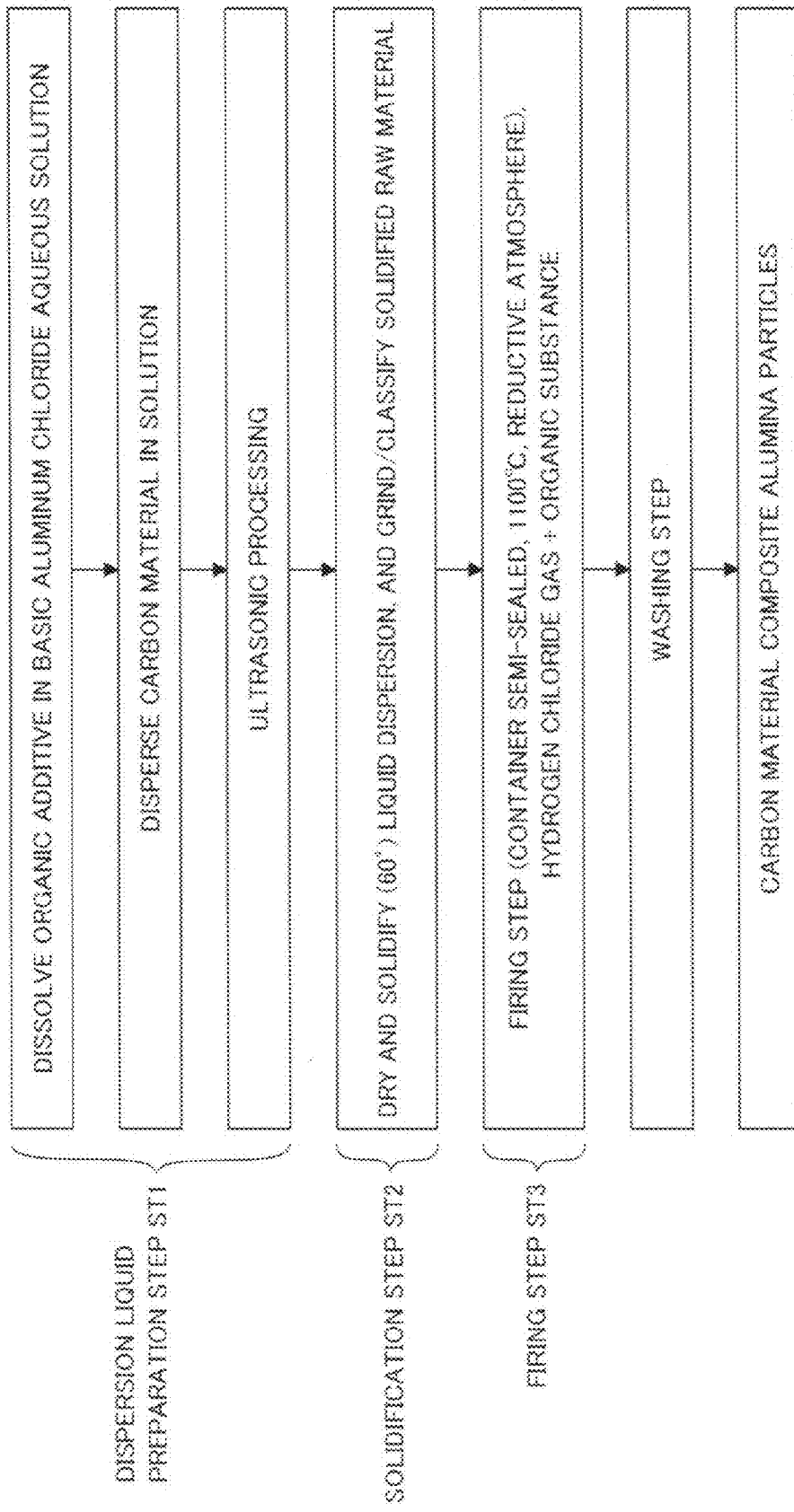
FIG. 1 is a process diagram showing the method for manufacturing an alumina composite according to Example 1 of the present invention.

In the method for manufacturing an alumina composite according to the present invention, a dispersion liquid preparation step is performed for dissolving an organic additive in an alumina raw material liquid and uniformly dispersing an inorganic material in the alumina raw material liquid to prepare a dispersion liquid, a solidification step is performed for drying the dispersion liquid to obtain a solidified raw material, and a firing step is performed for firing the solidified raw material in a non-oxidizing atmosphere while bringing hydrogen chloride into contact with the solidified raw material. As a result, an alumina composite can be obtained in which at least a portion of a carbon material or other inorganic material is embedded within single-crystal α-alumina particles which constitute alumina particles.

In the present invention, a material which itself can generate hydrogen chloride, such as a basic aluminum chloride solution, or a material which itself does not generate hydrogen chloride can be used as the alumina raw material liquid.

In the case of a material which itself does not generate hydrogen chloride, by supplying hydrogen chloride to the solidified raw material in the firing step, the solidified raw material can be sintered while hydrogen chloride is brought into contact with the solidified raw material. More specifically, after the organic additive is dissolved in the alumina raw material liquid, the carbon material is added, and after the carbon material is uniformly dispersed, the product is dried to obtain the solidified raw material. During firing of the obtained solidified raw material in a non-oxidizing atmosphere, hydrogen chloride is supplied to the solidified raw material (gel) and caused to act on the solidified raw material at the same time that the organic additive is caused to act as a template (mold) for the alumina particles in the processes of generation and growth of the single-crystal α-alumina particles. An alumina particle composite in which a carbon material or other inorganic material is partially buried in single-crystal α-alumina particles inside uniform alumina particles having a narrow particle size distribution can therefore be synthesized at a high yield.

Specifically, in the present invention, the three conditions described below are satisfied during synthesis of the alumina composite.

First condition: the carbon material is dispersed with extreme uniformity in the alumina raw material liquid.

Second condition: hydrogen chloride gas is caused to act on the solidified raw material in the processes of generation and growth of the single-crystal α-alumina particles.

Third condition: the organic additive is caused to act as a template between alumina particles in the processes of generation and growth of the single-crystal α-alumina particles.

In contrast, if a basic aluminum chloride solution is used as the alumina raw material liquid, since hydrogen chloride is generated from the basic aluminum chloride during sintering, during the firing step, even when the operation of bringing hydrogen chloride into contact with the solidified raw material is performed separately or not performed, the solidified raw material can be sintered while hydrogen chloride is brought into contact with the solidified raw material.

More specifically, when a basic aluminum chloride solution is used as the alumina raw material liquid, after the organic additive is dissolved in the alumina raw material liquid, the carbon material is added, and after the carbon material is uniformly dispersed, the product is dried to obtain the solidified raw material. During firing of the obtained solidified raw material in a non-oxidizing atmosphere, hydrogen chloride generated from the solidified raw material (gel) is caused to act at the same time that the organic additive is caused to act as a template (mold) for the alumina particles in the processes of generation and growth of the single-crystal α-alumina particles. An alumina particle composite in which a carbon material or other inorganic material is partially buried in single-crystal α-alumina particles inside uniform alumina particles having a narrow particle size distribution can therefore be synthesized at a high yield.

When a basic aluminum chloride solution is used as the alumina raw material liquid, the three conditions described below are satisfied.

First condition: the carbon material is dispersed with extreme uniformity in the alumina raw material liquid.

Second condition: hydrogen chloride gas generated from the basic aluminum chloride itself is caused to act on the solidified raw material in the processes of generation and growth of the single-crystal α-alumina particles.

Third condition: the organic additive is caused to act as a template between alumina particles in the processes of generation and growth of the single-crystal α-alumina particles.

Consequently, an alumina particle composite in which a carbon material or other inorganic material is partially buried inside single-crystal α-alumina particles can be synthesized at a high yield, and an alumina composite can be obtained in which the average particle diameter of the alumina particles is 0.1 to 100 μm, and the D90/D10 particle size distribution of the alumina composite is 10 or less, where D90 and D10 are the particle diameters for a cumulative 10% and a cumulative 90%, respectively, from the fine particle side of the cumulative particle size distribution of the alumina particles.

A method for dispersal by bead milling (ball milling) is preferred for use as the method for dispersing the inorganic material. The milling may be performed using a tumbling mill, a planetary mill, a vibrating mill, a medium-stirring-type mill, or the like. The smaller the diameter of the beads (balls) is, the greater the dispersive effect and the shorter the dispersion time can be. The material of the beads used for dispersion is not particularly limited, but alumina beads are preferred when incorporation of wear debris from the beads is considered. A method for dispersing the carbon material or other inorganic material in a liquid aluminum compound by ultrasonic dispersion may also be used. Dispersion by ultrasonic waves may be performed by a batch process or a continuous process. The dispersive effect increases and the dispersion time decreases as the output of the irradiated ultrasonic waves is increased. Dispersion by bead milling and dispersion by ultrasonic irradiation may also be combined. The degree of dispersion of the inorganic material can be arbitrarily changed according to purpose, etc., by changing the bead milling or ultrasonic irradiation time. The dispersion of the inorganic material is preferably uniform from a macro viewpoint, but from a micro viewpoint, the presence of fine aggregations may sometimes be preferred according to the purpose. For example, when nanocarbon is added to a matrix material having no electrical conductivity to impart electrical conductivity, when the nanocarbon is completely dispersed, the nanocarbon isolates in the matrix, and contact between nanocarbon units occurs only occasionally if at all. Electrical conductivity is therefore not obtained, or a large amount of nanocarbon must be added in order to impart electrical conductivity. When aggregates occur that are fine on a micro level, a network readily forms among aggregated particles, and electrical conductivity can be imparted even when the amount of added material is small.

The solidified raw material in which the dispersed inorganic material is solidified is obtained by solidifying the dispersion liquid in which the inorganic material is dispersed by the dispersion process. When the alumina raw material is an inorganic aluminum salt such as aluminum chloride, aluminum sulfate, or aluminum nitrate, for example, methods for solidification include solidification by heat concentration, and solidification by adding alkali to form a gel. When the alumina raw material is an aluminum alkoxide, solidification or gelling can be performed by a method of dealcoholization by heating, or by a method of hydrolysis by adding water. Methods for solidification when the alumina raw material is an aluminum salt include gelling by adding an alkali such as ammonia, gelling by adding ammonium sulfate, ammonium phosphate, or the like as a gelling agent while maintaining the volume of the solution, or gelling and solidification by condensation using thermal dehydration. Dehydration methods include a method for placing the dispersion liquid in a vat or other container and drying the dispersion liquid using a fan drying machine, a spray-drying method, a freeze-drying method, and other methods.

A filamentous inorganic material such as carbon nanotubes, silicon carbide whiskers, silicon nitride whiskers, titanium nanotubes, or the like can be used as the inorganic material in the present invention. A carbon material comprising any of single-wall carbon nanotubes, double-wall carbon nanotubes, multi-wall carbon nanotubes, carbon nanofibers, vapor-grown carbon fibers, and fullerenes, for example, can also be used as the inorganic material. Carbon nanotubes or fullerenes can be used as the nanocarbon. The shape of the carbon nanotubes is a one-dimensional cylinder in which a graphene sheet constituted of six-member rings of carbon atoms is rolled. A carbon nanotube having a structure formed by a single graphene sheet is referred to as a single-wall nanotube, and the diameter thereof is approximately 1 nm. A carbon nanotube having a structure formed by multiple layers of graphene sheets is referred to as a multi-wall carbon nanotube, the diameter thereof is several tens of nanometers, and examples thereof having larger diameters are known as carbon nanofibers and the like. Any type of carbon nanotubes may be used in the present invention, and the diameter, length, aspect ratio, and other characteristics of the nanotubes are not particularly limited. There are numerous types of fullerenes, such as C60 and C70 fullerenes comprising 60 or 70 carbon atoms, dimers and trimers in which two or three C60 fullerenes are bonded, and other fullerenes, but the type of fullerene used in the present invention is not particularly limited. Two or more types of these inorganic materials may also be used in combination.

(Alumina Raw Material)

The alumina raw material in the present invention is not necessarily limited, and a so-called aluminum compound is used. In particular, an aluminum compound containing chlorine and configured solely from a single liquid having a high aluminum concentration is preferred. When the aluminum concentration is low, the yield of alumina is reduced. When transition alumina, aluminum hydroxide, boehmite, or the like is used as the alumina raw material, since the three components of alumina raw material microparticles, the carbon material or other inorganic material, and a solvent are included, the carbon material or other inorganic material is difficult to uniformly disperse, and it is difficult to perform compounding so that the carbon material or other inorganic material is embedded inside the generated single-crystal α-alumina particles. However, in the case of an alumina raw material liquid such as boehmite sol in which fine particles are dispersed, since the carbon material or other inorganic material can be uniformly dispersed, compounding can be performed so that the carbon material or other inorganic material is embedded inside the generated single-crystal α-alumina particles. The aluminum compound preferably contains chlorine, in which case hydrogen chloride can be efficiently supplied in the firing step.

The solvent is not particularly limited, but water is preferred. Dispersion or drying solidification of the carbon material or other inorganic material is relatively easy, and there is also no flammability or other danger. In the present invention, the aluminum compound is an aluminum salt, for example. Basic aluminum chloride is particularly preferred for use. This basic aluminum chloride can be represented by the general formula $Al_2(OH)_nCl_{6-n}$ (where n≥3), for example.

(Organic Additive)

Figure 10:
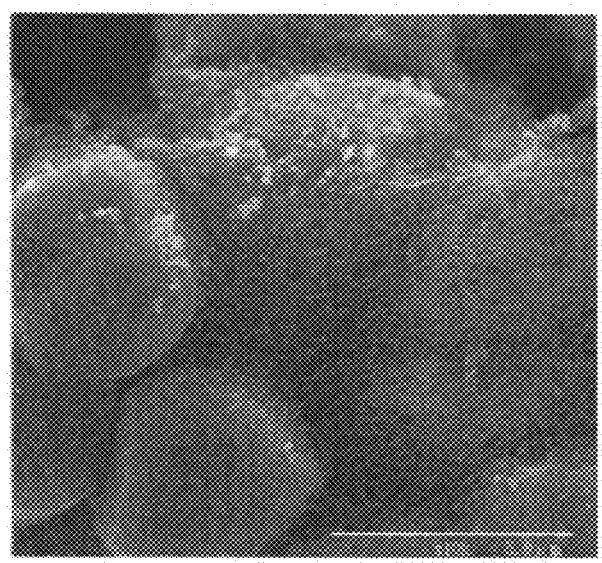
FIG. 10 is an electron micrograph showing the organic additive acting as a template between alumina particles.

FIG. 10 is an electron micrograph (10,000× magnification) showing the organic additive acting as a template between alumina particles. The organic additive has the two actions described below. First, the organic additive enhances the dispersibility of the carbon material or other inorganic material in the aluminum compound, and enables the carbon material or other inorganic material to be incorporated into and conjugated with the single-crystal α-alumina particles by decomposing and simplifying aggregation of the carbon material or other inorganic material. The inorganic additive also changes to a structure primarily comprising carbon in the temperature range in which alumina particles are generated, and acts as a template (mold) for alumina particles, whereby uniform alumina particles having a narrow size distribution are generated.

The organic additive is not particularly limited insofar as the organic additive exhibits the effects described above, but the organic additive may be a surfactant, a quaternary ammonium salt, a polyvinyl alcohol, aqueous cellulose, glycerin, glycol, polyethylene glycol, and organic acid, or the like.

Using a basic aluminum chloride solution as an example, the amount of the organic additive added is preferably in the range of 0.1 to 10 wt % (with respect to the basic aluminum chloride solution), more preferably 0.3 to 3.0 wt %. When too little of the organic additive is added, the carbon material or other inorganic material becomes difficult to disperse in the basic aluminum chloride solution, and the effect of the organic additive as a template during firing decreases. When the added amount is too great, growth of the α-alumina particles is inhibited, and there is a risk of an increased amount of residue of the organic additive after firing.

(Hydrogen Chloride)

In the firing step, it is preferred that adequate hydrogen chloride for the alumina be brought into contact when the hydrogen chloride is brought into contact with the solidified raw material. The source or method of supplying hydrogen chloride gas is not particularly limited insofar as hydrogen chloride gas can be introduced to the solidified raw material. Cylinder gas, or a solid or liquid chlorine compound, for example, can be used as the supply source. In this respect, since adequate hydrogen chloride is supplied in the process of generation or growth of alumina particles when basic aluminum chloride is used, an amount of 34 wt % in terms of chlorine with respect to alumina can be set to obtain satisfactory results. The amount of hydrogen chloride with respect to the total volume of atmospheric gas is preferably 1 vol % or greater, and more preferably 10 vol % or greater. Through this configuration, hydrogen chloride in the amount of 1 wt % or greater, preferably 10 wt % or greater, in terms of chlorine with respect to alumina can be brought into contact.

EXAMPLES

Examples 1 through 7 and Comparative Examples 1 and 2 will next be described. The main conditions and the dispersibility and other characteristics of the vapor-grown carbon fibers (VGCF) in the gel in Examples 1 through 7 and Comparative Examples 1 and 2 are shown in Table 1. The results of evaluating the particles obtained in Examples 1 through 7 and Comparative Examples 1 and 2 are shown in Table 2.

Figure 2:
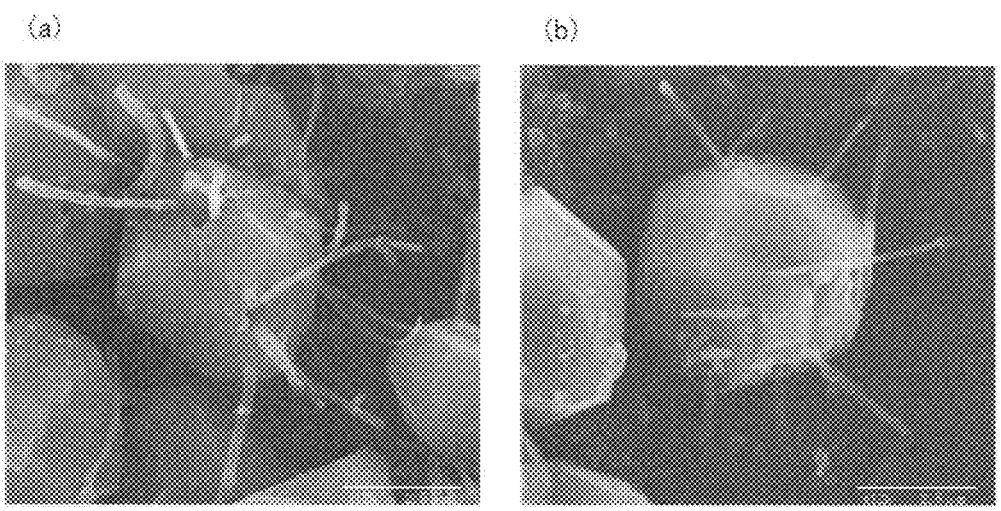
FIG. 2 is an electron micrograph showing the alumina composite according to Example 1 of the present invention.
Figure 3:
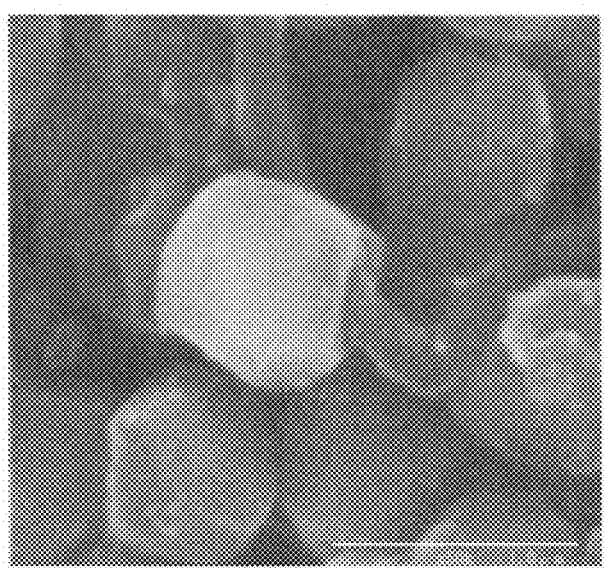
FIG. 3 is an electron micrograph showing the alumina composite according to Example 2 of the present invention.
Figure 4:
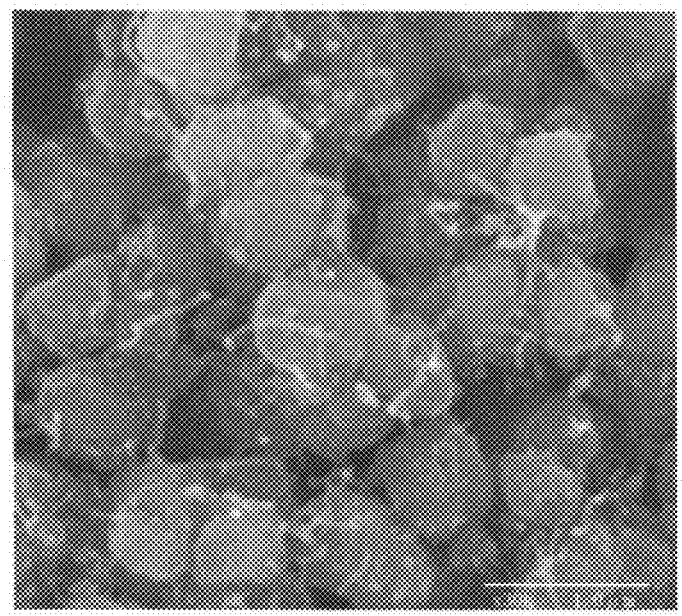
FIG. 4 is an electron micrograph showing the alumina composite according to Example 3 of the present invention.
Figure 5:
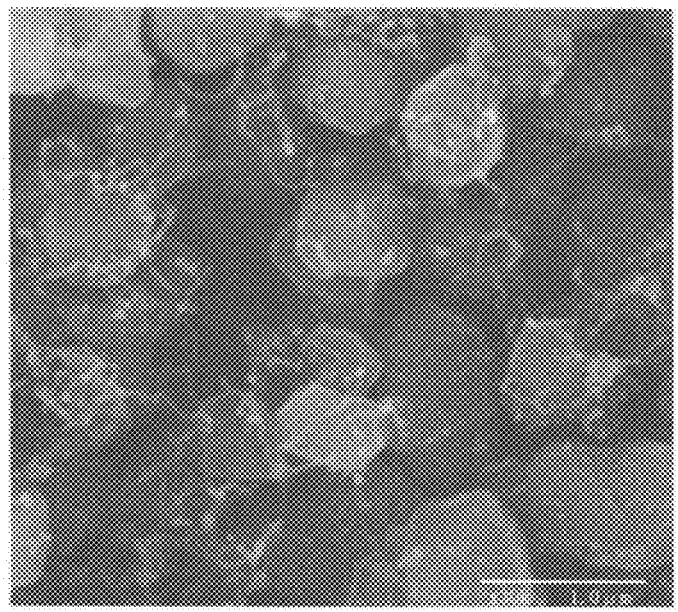
FIG. 5 is an electron micrograph showing the alumina composite according to Example 4 of the present invention.
Figure 6:
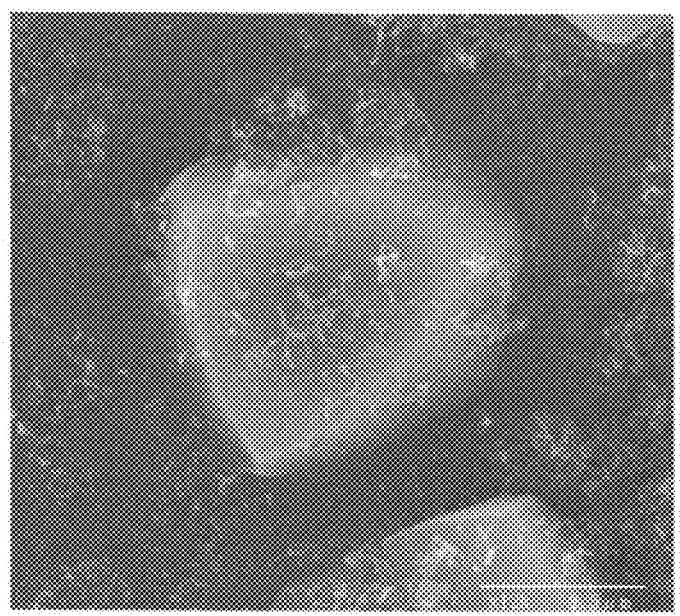
FIG. 6 is an electron micrograph showing the alumina composite according to Example 5 of the present invention.
Figure 7:
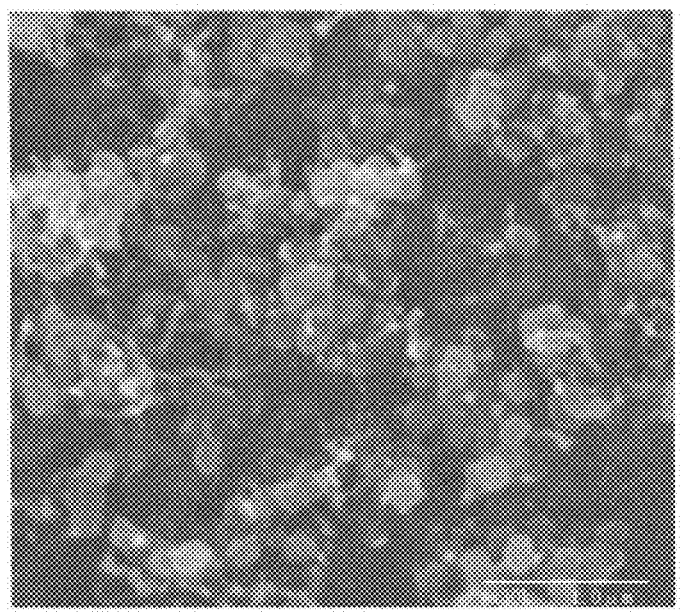
FIG. 7 is an electron micrograph showing the alumina composite according to Example 6 of the present invention.
Figure 8:
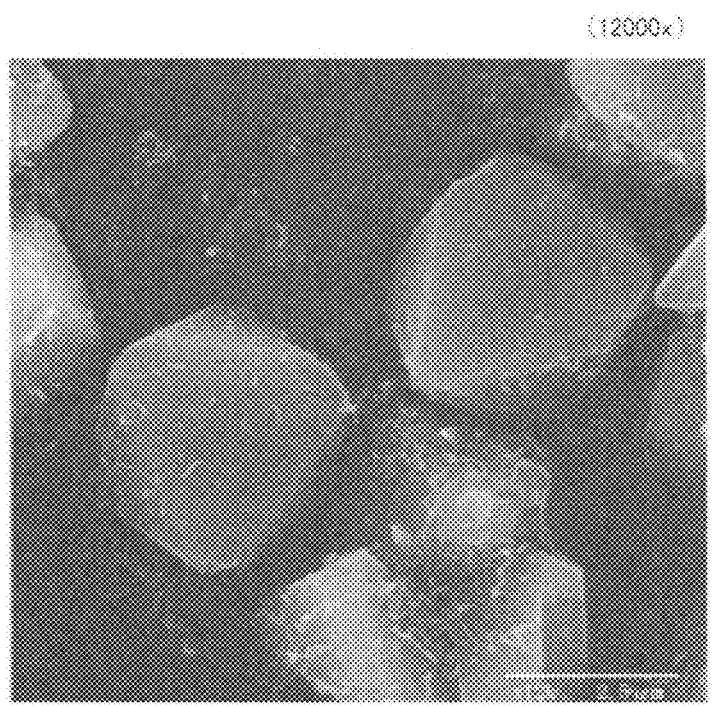
FIG. 8 is an electron micrograph showing the alumina composite according to Example 7 of the present invention.

FIGS. 2 through 9 are electron micrographs showing the alumina composite according to the examples of the present invention, and electron micrographs showing the alumina particles according to comparative examples. Specifically, FIG. 2 is an electron micrograph showing the alumina composite according to Example 1 of the present invention. FIG. 3 is an electron micrograph showing the alumina composite according to Example 2 of the present invention. FIG. 4 is an electron micrograph showing the alumina composite according to Example 3 of the present invention. FIG. 5 is an electron micrograph showing the alumina composite according to Example 4 of the present invention. FIG. 6 is an electron micrograph showing the alumina composite according to Example 5 of the present invention. FIG. 7 is an electron micrograph showing the alumina composite according to Example 6 of the present invention. FIG. 8 is an electron micrograph showing the alumina composite according to Example 7 of the present invention. FIG. 9 is an electron micrograph showing the alumina particles according to Comparative Example 2 of the present invention. The magnification in FIGS. 2(a), 2(b), 6, 8, and 9(a) is 12,000×, the magnification in FIG. 3 is 50,000×, the magnification in FIGS. 4, 5, and 7 is 30,000×, and the magnification in FIG. 9(b) is 2,500×.

TABLE 1

| | Dispersion method | VGCF diameter (nm) | VGCF dispersibility in gel | Organic additive (wt %) | Alumina seed crystals (wt %) | Firing temperature (° C.) |
|---|---|---|---|---|---|---|
| Example 1 | Ultrasonic homogenizer | 150 | ⊚ | 1.5 | 0 | 1100 |
| Example 2 | Ultrasonic homogenizer | 150 | ⊚ | 1.5 | 0.5 | 950 |
| Example 3 | Ultrasonic homogenizer | 15 | ○ | 1.5 | 0.5 | 950 |
| Example 4 | Nanomizer | 15 | ⊚ | 1.5 | 0.5 | 950 |
| Example 5 | Nanomizer | 15 | ⊚ | 1.5 | 0 | 1100 |
| Example 6 | Planetary ball mill | 15 | ○ | 1.5 | 0.5 | 950 |
| Example 7 | Nanomizer | 15 | ○ | 1.5 | 0 | 1100 |
| Comparative Example 1 | Ultrasonic homogenizer | 150 | X | 0 | 0 | 1100 |
| Comparative Example 2 | Ultrasonic homogenizer | 150 | Δ | 1.5 | 0 | 1200 |

TABLE 2

| | Average particle diameter (μm) | D90/D10 | VGCF content (wt %) | VGCF compounding | Volume resistivity of resin composite (Ω · cm) |
|---|---|---|---|---|---|
| Example 1 | 8.3 | 2.4 | 4.7 | ⊚ | $1.8 \times 10^5$ |
| Example 2 | 1.5 | 3.4 | 4.2 | ○ | $2.5 \times 10^4$ |
| Example 3 | 1.2 | 4.1 | 1.5 | ○ | $2.3 \times 10^3$ |
| Example 4 | 1.2 | 3.5 | 1.5 | ⊚ | $3.9 \times 10^2$ |
| Example 5 | 8.3 | 2.3 | 2.0 | ⊚ | $9.9 \times 10^1$ |
| Example 6 | 0.3 | 37.9 | 1.9 | Δ | $1.2 \times 10^3$ |
| Example 7 | 4.7 | 1.9 | 2.1 | ○ | $9.4 \times 10^2$ |
| Comparative Example 1 | — | — | — | — | — |
| Comparative Example 2 | 48.9 | 2.4 | 0.2 | X | — |

Example 1

FIG. 1 is a process diagram showing the method for manufacturing an alumina composite according to Example 1 of the present invention. As shown in FIG. 1, in the dispersion liquid preparation step ST1 in the present embodiment, 1.5 wt % of EMULGEN A-60 (polyoxyethylene styrenated phenyl ether, manufactured by Kao Corporation) as an organic additive was first added to and dissolved in a basic aluminum chloride aqueous solution (compositional formula: $Al_2(OH)_5Cl_1$/aluminum oxide concentration: 23.5%, basicity: 83%) as an alumina raw material liquid. Then, 5.0 wt % (with respect to aluminum oxide) of VGCF (vapor-grown carbon fibers; diameter: 150 nm; manufactured by Showa Denko K. K.) was added to the solution and uniformly dispersed using an ultrasonic homogenizer, and a dispersion liquid was obtained.

Then, in the solidification step ST2, the dispersion liquid having been thinly spread onto a flat sheet was dried at 60° C., and a gel (solidified raw material) having a thickness of approximately 1 mm was obtained.

Then, in the firing step ST3, the obtained gel was ground and subsequently classified to a size of 250 μm or less, and the resultant gel powder was loaded into a firing container. The container was covered and placed in a semi-sealed state. The gel powder was then fired in a reductive atmosphere (non-oxidizing atmosphere) using a firing furnace under conditions of a heat-up time of five hours and a temperature of 1100° C. maintained for two hours. Residual organic substances and non-compounded excess VGCF were removed by washing the obtained powder in ethanol, and the intended composite particles (alumina composite) were obtained.

When the composite particles were observed using an electron microscope, it was confirmed that a plurality of VGCF were incorporated inside single-crystal alumina particles having a size of approximately 5 μm and compounded so as to penetrate through the particles, as shown in FIGS. 2(a) and 2(b).

The obtained composite particles were fired for 30 minutes at 950° C. in air, and after the VGCF in the composite particles were removed, the VGCF content was calculated by measuring the decrease in weight. The resulting VGCF content was 4.7 wt % (with respect to aluminum oxide). The alumina particles from which the VGCF had been removed by firing were measured as having an average particle diameter of 8.3 μm using a laser diffraction particle size distribution analyzer. The alumina particles had a sharp particle size distribution, and the D90/D10 ratio was 2.4.

A resin composite (polymer composition containing the alumina composite) was then produced by mixing 100 parts by weight of the composite particles and 100 parts by weight of epoxy resin, and heating the mixture at 130° C. The volume resistivity thereof was measured as being $1.8 \times 10^5$ Ω·cm, and the resin composite was electrically conductive.

Example 2

In the dispersion liquid preparation step ST1, 1.5 wt % of EMULGEN A-60 (polyoxyethylene styrenated phenyl ether) as an organic additive was first added to and dissolved in a basic aluminum chloride aqueous solution (aluminum oxide concentration: 23.5%, basicity: 83%) as an alumina raw material liquid. Then, 5.0 wt % (with respect to aluminum oxide) of VGCF (vapor-grown carbon fibers; diameter: 150 nm; manufactured by Showa Denko K. K.) was added to the solution and uniformly dispersed using an ultrasonic homogenizer, and a dispersion liquid was obtained. Meanwhile, alumina powder (average particle diameter: 0.15 μm) as seed crystals was mixed in an ethanol solvent in a ratio of 30 wt % and processed for 30 minutes in a planetary ball mill to form a slurry. The slurry was then added to the dispersion liquid at a ratio of 0.5 wt % in terms of aluminum oxide, then stirred, and a uniform dispersion liquid was obtained using an ultrasonic homogenizer.

Then, in the solidification step ST2, the dispersion liquid having been thinly spread onto a flat sheet was dried at 60° C., and a gel (solidified raw material) having a thickness of approximately 1 mm was obtained.

Then, in the firing step ST3, the obtained gel was ground and subsequently classified to a size of 250 μm or less, and the resultant gel powder was loaded into a firing container. The container was covered and placed in a semi-sealed state. With a reductive atmosphere inside the firing furnace, the gel powder was then fired under conditions of a heat-up time of five hours and a temperature of 950° C. maintained for two hours. Residual organic substances and excess VGCF were removed by washing the obtained powder in ethanol, and the intended composite particles (alumina composite) were obtained.

When the composite particles were observed using an electron microscope, it was confirmed that VGCF were compounded so as to penetrate through the inside of single-crystal alumina particles having a size of approximately 1 μm, as shown in FIG. 3.

The composite particles were fired for 30 minutes at 950° C., and after the VGCF in the composite particles were removed, the VGCF content was calculated by measuring the decrease in weight. The resulting VGCF content was 4.2 wt %.

The alumina particles from which the VGCF had been removed by firing were measured as having an average particle diameter of 1.5 μm using a laser diffraction particle size distribution analyzer. The alumina particles had a sharp particle size distribution, and the D90/D10 ratio was 3.4.

A resin composite (polymer composition containing the alumina composite) was then produced by mixing 100 parts by weight of the composite particles and 100 parts by weight of epoxy resin, and heating the mixture at 130° C. The volume resistivity thereof was measured as being $2.5 \times 10^4$ Ω·cm, and the resin composite was electrically conductive.

Example 3

A powder of composite particles (alumina composite) was obtained by the same method as in Example 2, except that the diameter of the added VGCF was 15 nm, and the added quantity of VGCF was 1.5 wt % (with respect to aluminum oxide).

When the composite particles were observed using an electron microscope, it was confirmed that VGCF were compounded so as to be embedded inside single-crystal alumina particles having a size of approximately 1 μm, as shown in FIG. 4.

The composite particles were fired for 30 minutes at 950° C., and after the VGCF in the composite particles were removed, the VGCF content was calculated by measuring the decrease in weight. The resulting VGCF content was 1.5 wt %.

The alumina particles from which the VGCF had been removed by firing were measured as having an average particle diameter of 1.2 μm using a laser diffraction particle size distribution analyzer. The alumina particles had a sharp particle size distribution, and the D90/D10 ratio was 4.1.

A resin composite (polymer composition containing the alumina composite) was then produced by mixing 100 parts by weight of the composite particles and 100 parts by weight of epoxy resin, and heating the mixture at 130° C. The volume resistivity thereof was measured as being $2.3 \times 10^3$ Ω·cm, and the resin composite was electrically conductive.

Example 4

In the dispersion liquid preparation step ST1, 1.5 wt % of EMULGEN A-60 (polyoxyethylene styrenated phenyl ether)

as an organic additive was first added to and dissolved in a basic aluminum chloride aqueous solution (aluminum oxide concentration: 23.5%, basicity: 83%) as an alumina raw material liquid. Then, the same seed crystal slurry as in Example 2 was added in a ratio of 0.5 wt % in terms of aluminum oxide while the mixture was stirred, and a uniform solution was obtained. Then, 1.5 wt % (with respect to aluminum oxide) of VGCF (diameter: 15 nm) was added, dispersion was subsequently performed using a nanomizer (manufactured by Yoshida Kikai Co., Ltd.), and a uniform dispersion liquid was obtained.

A powder of composite particles (alumina composite) was obtained by the same method as in Example 2 with regard to the solidification step ST2 and subsequent steps.

When the composite particles were observed using an electron microscope, it was confirmed that VGCF were compounded so as to be embedded inside single-crystal alumina particles having a size of approximately 1 μm, as shown in FIG. 5.

The composite particles were fired for 30 minutes at 950° C., and after the VGCF in the composite particles were removed, the VGCF content was calculated by measuring the decrease in weight. The resulting VGCF content was 1.5 wt %.

The alumina particles from which the VGCF had been removed by firing were measured as having an average particle diameter of 1.2 μm using a laser diffraction particle size distribution analyzer. The alumina particles had a sharp particle size distribution, and the D90/D10 ratio was 3.5.

A resin composite (polymer composition containing the alumina composite) was then produced by mixing 100 parts by weight of the composite particles and 100 parts by weight of epoxy resin, and heating the mixture at 130° C. The volume resistivity thereof was measured as being $3.9 \times 10^2$ Ω·cm, and the resin composite was electrically conductive.

Example 5

A powder of composite particles (alumina composite) was obtained by the same method as in Example 4, except that a seed crystal slurry was not added and the firing temperature was 1100° C.

When the composite particles were observed using an electron microscope, it was confirmed that VGCF were compounded so as to be embedded inside single-crystal alumina particles having a size of approximately 5 μm, as shown in FIG. 6.

The composite particles were fired for 30 minutes at 950° C., and after the VGCF in the composite particles were removed, the VGCF content was calculated by measuring the decrease in weight. The resulting VGCF content was 2.0 wt %.

The alumina particles from which the VGCF had been removed by firing were measured as having an average particle diameter of 8.3 μm using a laser diffraction particle size distribution analyzer. The alumina particles had a sharp particle size distribution, and the D90/D10 ratio was 2.3.

A resin composite (polymer composition containing the alumina composite) was then produced by mixing 100 parts by weight of the composite particles and 100 parts by weight of epoxy resin, and heating the mixture at 130° C. The volume resistivity thereof was measured as being $9.9 \times 10^1$ Ω·cm, and the resin composite was electrically conductive.

Example 6

In the dispersion liquid preparation step ST1, 1.5 wt % of EMULGEN A-60 (polyoxyethylene styrenated phenyl ether) as an organic additive was first added to and dissolved in a basic aluminum chloride aqueous solution (aluminum oxide concentration: 23.5%, basicity: 83%) as an alumina raw material liquid. Then, the same seed crystal slurry as in Example 2 was added in a ratio of 0.5 wt % in terms of aluminum oxide while the mixture was stirred, and a uniform solution was obtained. Then, 1.5 wt % (with respect to aluminum oxide) of VGCF (diameter: 15 nm) was added, dispersion was subsequently performed for 30 minutes using a planetary ball mill, and a uniform dispersion liquid was obtained.

A powder of composite particles (alumina composite) was obtained by the same method as in Example 2 with regard to the solidification step ST2 and subsequent steps.

When the composite particles were observed using an electron microscope, it was confirmed that VGCF were compounded so as to be embedded inside single-crystal alumina particles having a size of approximately 0.3 μm, as shown in FIG. 7.

The composite particles were fired for 30 minutes at 950° C., and after the VGCF in the composite particles were removed, the VGCF content was calculated by measuring the decrease in weight. The resulting VGCF content was 1.9 wt %.

The average particle diameter of the composite particles was 0.3 μm as measured by electron microscope. The D90/D10 ratio calculated using a laser diffraction particle size distribution analyzer was 37.9.

A resin composite (polymer composition containing the alumina composite) was then produced by mixing 100 parts by weight of the composite particles and 100 parts by weight of epoxy resin, and heating the mixture at 130° C. The volume resistivity thereof was measured as being $1.2 \times 10^3$ Ω·cm, and the resin composite was electrically conductive.

Example 7

In the dispersion liquid preparation step ST1, 1.5 wt % of EMULGEN A-60 (polyoxyethylene styrenated phenyl ether) as an organic additive was first added to and dissolved in boehmite sol (trade name: ALUMINA SOL 100, manufactured by Nissan Chemical Industries, Ltd., aluminum oxide concentration: 10%) as an alumina raw material liquid, and a uniform alumina raw material liquid was obtained. Then, 1.5 wt % (with respect to aluminum oxide) of VGCF (diameter: 15 nm) was added, dispersion was subsequently performed using a nanomizer (manufactured by Yoshida Kikai Co., Ltd.), and a uniform dispersion liquid was obtained.

By the solidification step ST2 and subsequent steps, a powder of composite particles (alumina composite) was obtained by the same method as in Example 2, except that the firing temperature was set to 1100° C. In the present example, however, in order to bring the solidified raw material and hydrogen chloride into contact with each other in the firing step, a container in which a basic aluminum chloride gel had been placed was provided inside the firing container, and firing was performed so as to give the same hydrogen chloride concentration as in Example 1.

When the composite particles were observed using an electron microscope, it was confirmed that VGCF were compounded so as to be embedded inside single-crystal alumina particles having a size of approximately 2.5 μm, as shown in FIG. 8.

The composite particles were fired for 30 minutes at 950° C., and after the VGCF in the composite particles were removed, the VGCF content was calculated by measuring the decrease in weight. The resulting VGCF content was 2.1 wt %.

The alumina particles from which the VGCF had been removed by firing were measured as having an average particle diameter of 4.7 μm using a laser diffraction particle size distribution analyzer, and the D90/D10 ratio thereof was 1.9.

A resin composite (polymer composition containing the alumina composite) was then produced by mixing 100 parts by weight of the composite particles and 100 parts by weight of epoxy resin, and heating the mixture at 130° C. The volume resistivity thereof was measured as being $9.4 \times 10^2$ Ω·cm, and the resin composite was electrically conductive.

Comparative Example 1

Without Organic Substance for Template

An experiment was conducted using the same method as in Example 1, except that EMULGEN A-60 was not added to the basic aluminum chloride aqueous solution. However, it was difficult to disperse VGCF in the basic aluminum chloride aqueous solution, and the experiment was stopped.

Comparative Example 2

Aluminum Hydroxide Raw Material

Aluminum hydroxide (B52, manufactured by Nippon Light Metal Co., Ltd.) was dispersed in deionized water to prepare a slurry having an aluminum oxide concentration of 8.0%. A powder was obtained by the same method as in Example 1 using this slurry. In the present example, however, the solidified raw material and hydrogen chloride were not brought into contact in the firing step.

As shown in FIGS. 9(a) and (b), when the particles were observed using an electron microscope, the presence of coarse alumina particles having a size of several tens of microns was confirmed, but almost no VGCF was incorporated in the alumina particles.

The composite particles were fired for 30 minutes at 950° C., and after the VGCF in the composite particles were removed, the VGCF content was calculated by measuring the decrease in weight. The resulting VGCF content was 0.2 wt %.

The alumina particles from which the VGCF had been removed by firing were measured as having an average particle diameter of 48.9 μm using a laser diffraction particle size distribution analyzer, and the D90/D10 ratio thereof was 2.4.

A resin composite was then produced by mixing 100 parts by weight of the composite particles and 100 parts by weight of epoxy resin, and heating the mixture at 130° C. Measuring the volume resistivity thereof showed no electrical conductivity.

Other Examples

The alumina matrix in the present invention may contain alkali metals, alkaline earth metals, rare-earth elements, transition metals, and other elements. Silicon carbide whiskers, silicon nitride whiskers, titanium nanotubes, and the like may also be used as the inorganic material.

INDUSTRIAL APPLICABILITY

In the alumina composite according to the present invention, in uniform alumina particles having a narrow particle size distribution, a carbon material or other inorganic material is at least partially embedded inside single-crystal α-alumina particles which constitute the alumina particles, and is completely integrated and compounded therewith. The obtained alumina composite is therefore provided with characteristics of both the inorganic material and the alumina particles. In the obtained alumina composite, the formation of strong aggregates of inorganic materials with each other is prevented even for inorganic materials such as carbon materials, which are generally considered to be difficult to disperse in water and other solvents, or in resins, metals, ceramics, and other matrices, and the alumina composite can easily be dispersed in water and other solvents, or in resins, metals, ceramics, and other matrices. An advantageous effect is therefore gained in that the characteristics of alumina and the inorganic material can be uniformly imparted to water and other solvents, or to resins, metals, ceramics, and other matrices. Consequently, when a carbon material, for example, is used as the inorganic material, novel materials can be applied having numerous features, such as electrical conduction properties, heat conduction properties, and the strength, wear resistance, heat resistance, and ease of dispersion of alumina. The present invention is therefore extremely useful for application in resin additives, rubber additives, ceramic additives, metal additives, and other fillers for imparting functionality, in additives for cells (Li-ion secondary cells, capacitors, fuel cells, and the like), and in abrasives, raw materials for sealants, raw materials for porous bodies, and other applications.

The invention claimed is:

1. An alumina composite comprising:
   single-crystal α-alumina particles constituting alumina particles; and
   a filamentous inorganic material at least partially embedded inside the single-crystal α-alumina particles.

2. The alumina composite according to claim 1, wherein the inorganic material is a carbon material selected from single-wall carbon nanotubes, double-wall carbon nanotubes, multi-wall carbon nanotubes, carbon nanofibers, and vapor-grown carbon fibers.

3. The alumina composite according to claim 1 or 2, wherein
   an average particle diameter of the alumina particles is 0.1 to 100 μm, and
   a D90/D10 particle size distribution of the alumina particles is 10 or less, where D90 and D10 are particle diameters for a cumulative 10% and a cumulative 90%, respectively, from a fine particle side of a cumulative particle size distribution of the alumina particles.

4. A polymer composite containing an alumina composite, wherein
   the alumina composite is one according to claim 1 or 2, and is impregnated into a resin or rubber.

* * * * *